(12) United States Patent
Mikk

(10) Patent No.: US 7,613,593 B2
(45) Date of Patent: Nov. 3, 2009

(54) METHODS FOR CONFIGURING AN ELECTRICAL SYSTEM

(75) Inventor: Erich Mikk, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 933 days.

(21) Appl. No.: 10/775,331

(22) Filed: Feb. 11, 2004

(65) Prior Publication Data

US 2004/0230405 A1 Nov. 18, 2004

(30) Foreign Application Priority Data

Feb. 11, 2003 (DE) ................. 103 05 637

(51) Int. Cl.
*G06F 17/50* (2006.01)
(52) U.S. Cl. ........................................ 703/1
(58) Field of Classification Search .............. 703/1, 703/2
See application file for complete search history.

(56) References Cited

U.S. PATENT DOCUMENTS

| | | | |
|---|---|---|---|
| 6,379,164 B1 * | 4/2002 | Cash, Jr. .................. | 439/106 |
| 6,618,856 B2 * | 9/2003 | Coburn et al. ............ | 717/135 |
| 2002/0007348 A1 | 1/2002 | Ali et al. | |
| 2002/0188622 A1 | 12/2002 | Wallen et al. | |
| 2003/0121147 A1 * | 7/2003 | Cheng .................... | 29/854 |
| 2004/0103390 A1 * | 5/2004 | Gatzemeier ............. | 717/120 |

FOREIGN PATENT DOCUMENTS

EP 1 197 923 A2 4/2002

WO WO 01/33315 A2 5/2001

OTHER PUBLICATIONS

New and substantially Improved Buildings, Electrical Systems, Nov. 2000.*
Siemens Simatic Report, "Good Planning is Half-way There", Apr. 1996, pp. 1-5.
Siemens, "SIMATIC WINcc Version 6, Prozessvisualisierung für Platform fur IT and Business Integration", pp. 1-2.
Siemens Informationstechnologie in der Automatisierungstechnik, pp. 1-26, 1999/2000.
"Informationstechnologie in der Automatisierungstechnik"; Ihc-div. web.cern.ch/Ihc-div/IndCtrl/GUAPI/CD-SimaticNet/Info/WPITlution76.pdf; Apr. 1999; p. 20.
"Good Planning is Half-way There"; Simatic Report; www.ad. siemens.de/news/html76/simrepo/4—96/html76/prod11.htm; Jan. 28, 2003; pp. 1-6.
Prozesse Optimal Visualisieren SIMATIC WinCC setzt die Trends; printed from www.ad.siemens.de/hmi/html— 00/products/software/wincc/index.htm; Jan. 28, 2003; pp. 1-2.

(Continued)

*Primary Examiner*—Paul L Rodriguez
*Assistant Examiner*—Andre Pierre Louis
(74) *Attorney, Agent, or Firm*—Staas & Halsey LLP

(57) ABSTRACT

Different sets of representations of function blocks of a system are configured, e.g. function blocks in a Continuous Function Chart (CFC) and objects in the WinCC visualization tool, which refer back to a common database. Information about corresponding sets of representations of the system's function blocks is converted into two, e.g. HTML, documents, each having references to the other set of representations, thereby allowing navigation from one representation to the other as well as consistent modification in a plurality of representations simultaneously.

4 Claims, 2 Drawing Sheets

OTHER PUBLICATIONS

Windows Control Center—Alle Bedien-und Bobachtungsfunktionen an Bord, printed from www.adsiemens,de/hmi/html_00/products/software/wincc/functions01.htm on Jan. 28, 2003; pp. 1-2.

Simatic WinCC: Prozessvisualisierung und Plattform für IT & Business Integration; printed from www2.automation.siemens.com/xsalesmaterial-as/productbrief/de/kb_wincc_overview_d.pdf.on Sep. 14, 2005; pp. 1-16.

CFC—Simatic Industrial Software: Continuous Function Chart CFC; found at www.2.automation.siemens.com/simatic/industries-software/html_76/produckte/software-cfc.htm Sep. 14, 2005; 1 page.

S. Q. Xie et al., A WWW-Based Information Management System for Rapid and Integrated Mould Product Development; International Journal Advanced Manufacturing Technology, vol. 20, No. 1, 2002, pp. 50-57.

D. Tony Liu et al.; "A Review of Web-based Product Data Management Systems", Computers in Industry, vol. 44, No. 3, Apr. 2001, pp. 251-262.

* cited by examiner

METHODS FOR CONFIGURING AN ELECTRICAL SYSTEM

CROSS REFERENCE TO RELATED APPLICATIONS

This application is based on and hereby claims priority to German Application No. 10305637.8 filed on 11 Feb. 2003, the contents of which are hereby incorporated by reference.

BACKGROUND OF THE INVENTION

The invention relates to methods for configuring an electrical system, particularly the configuration of building and plant installations or the configuration of a European Installation Bus (EIB), whereby systems are configured simultaneously in various representations, e.g. in a Continuous Function Chart (CFC) and in a human-machine interface such as the WinCC® operator control and visualization tool. Continuous Function Charts or CFCs are frequently used for planning automation tasks, e.g. for the planning of Simatic controls.

At the same time, the human-machine interfaces for an automation task, e.g. the planning of a Simatic control, are also frequently configured and modified simultaneously or in step with the preparation of the CFC. For example, a visualization possibility of this kind for a Simatic control has been described using the WinCC® program.

To navigate in the engineering data, a configuration engineer generally has to familiarize himself with the individual navigation functions of every single application. For example, to search for linked data in several engineering tools, the configuration engineer has to navigate simultaneously in all the tools involved. Sideways navigation along the linked data between the tools requires considerable operator effort and knowledge of the relevant filing schemes, whereas locating and filing engineering data requires knowledge of the industry- or project-specific conventions. Applying the conventions involves a certain amount of familiarization effort and requires a degree of care and is therefore time-intensive. The data has until now been filed on an application-specific basis and can only be located by interactive operator input in the application itself. The current engineering data is not linked to any documentation of the system to be configured, resulting in increased documentation maintenance after any modification of the engineering data. Present day engineering tools support the configuration engineer in filing the engineering data in accordance with conventions, subject to the limitation that the data must be filed hierarchically. This prevents any cross-linking of the data in the filing schemes or any inter-applicational data filing. The engineering data in the plant documentation is usually only a copy of the actual data, which means that the document must be laboriously updated manually after each modification.

As described on page 20 of the Siemens ITlution White Paper entitled "Informations-technologie in der Automatisierungstechnik" (Information Technology in Automation Engineering), April 1999, for uniform navigation to all the information, an appropriate layout as a web site with individual pages networked via hyperlinks is required, the hierarchical component structure of the plant defining a structure for the web site. This document also suggests that greater flexibility and easier modifiability can be achieved by a strict separation of structure and user data.

SUMMARY OF THE INVENTION

An object of the invention is to specify methods for configuring an electrical system wherein the abovementioned disadvantages are avoided and configuration is made as quick and consistent as possible.

The essence of the invention is that different sets of representations of function blocks of a system to be configured, e.g. function blocks in a Continuous Function Chart (CFC) and objects in the WinCC visualization tool, refer back to a common database and the information about the corresponding sets of representations of the system's function blocks is converted into two HTML documents each having references to the other set of representations in each case, thereby allowing navigation from one representation to the other as well as consistent modification in a plurality of representations simultaneously.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
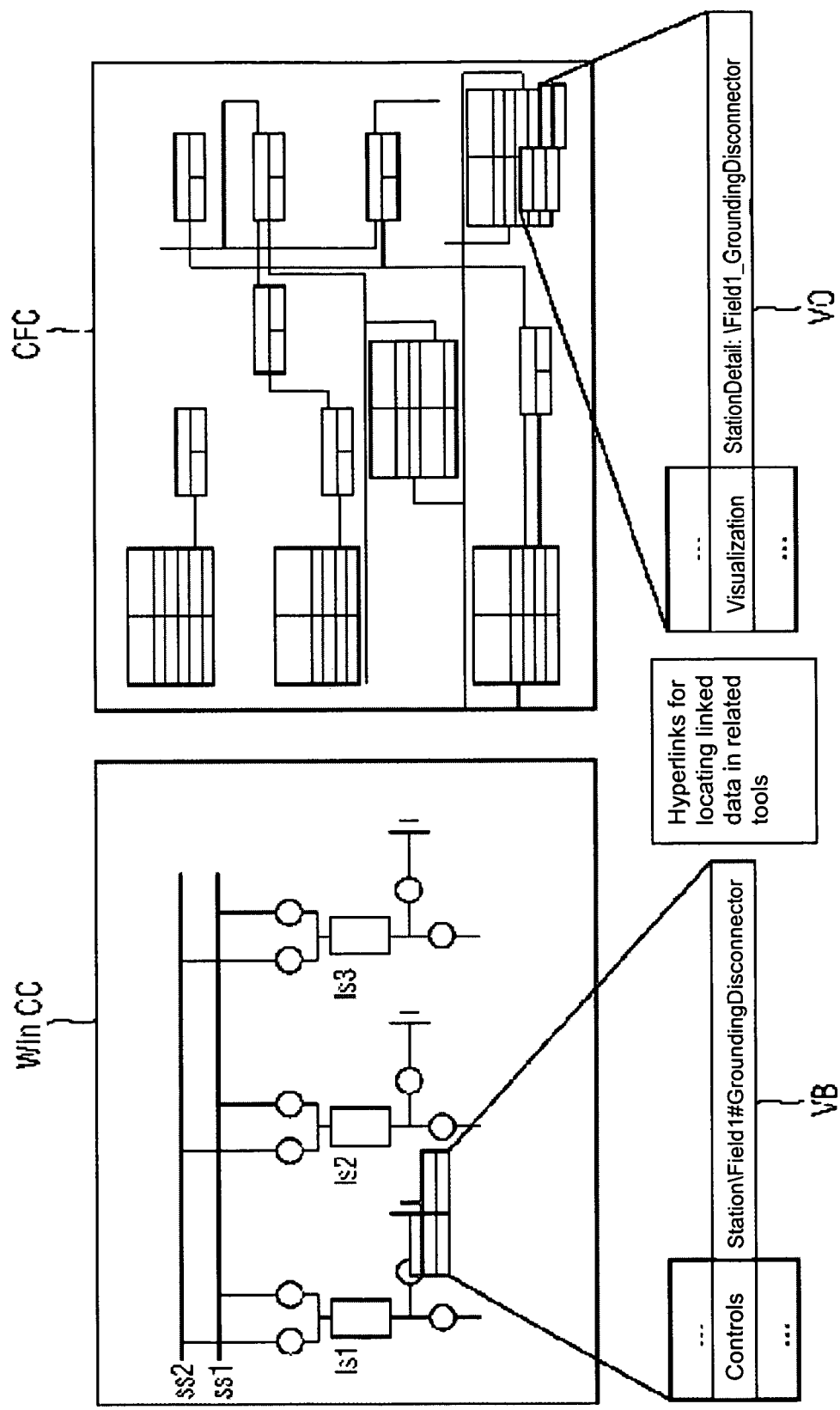
FIG. 1 is a functional block diagram for an electrical system in the form of a first CFC set and a corresponding second set of WinCC representations.

Reference will now be made in detail to the preferred embodiments of the present invention, examples of which are illustrated in the accompanying drawings, wherein like reference numerals refer to like elements throughout.

FIG. 1 shows sections of the function blocks to be configured for an electrical system in the form of a first CFC set and a corresponding second set of WinCC representations. The first set of representations may exist, for example, in a Continuous Function Chart or CFC and the second set of representations, e.g. for the WinCC® human-machine interface. The display of the first set of representations, i.e. the CFC for example, contains elements with references VO to the objects of a related tool, such as WinCC, a reference VO of this kind including, e.g. the following components:

Visualization: (designation of the related tool or of the other set of representations)

StationDetail: (the location in the related tool, in this case therefore in the WinCC visualization tool)

Field1_GroundingDisconnector: (the concrete entry for StationDetail)

Correspondingly, in the second set of representations, i.e. in the WinCC visualization tool, for example, at a specific location, i.e. for the grounding disconnector of Field1, a reference VB is present having the following form:

Controls (the reference to the relevant related tool, i.e. the Continuous Function Chart, for example)

Station\ (an entry specifying the CFC station in which the function block is located)

Field1#GroundingDisconnector (an entry specifying the function block involved)

For the two references VB and VO, only one related tool, i.e. Controls or Visualization, for example, is concretely specified in each case; however, the ". . ." entry indicates that, in principle, any number of related tools or sets of representations can be unambiguously connected or linked in this way.

For example, for configuring an electrical system, function blocks and objects are first configured in the CFC tool and in the WinCC tool respectively, a correspondence existing between the configured function blocks and the objects or symbols which is established by the configuration engineer as part of the configuration process. First, the configuration engineer then performs a so-called "mapper" which creates communication variables in WinCC which are associated with the configured function blocks. Second, the configuration engineer then usually assigns one or more communication variables in WinCC to the configured WinCC object, which means that the correspondence between the configured function blocks and the WinCC objects is configured. According to the invention, the information about the corresponding function blocks and WinCC objects is then converted in each case into two documents of a page description language, e.g. HTML or XML, using a database and the associated functions, an HTML document containing the references to the corresponding WinCC objects being associated, for example, with a function block and an HTML document containing the references to the corresponding function blocks in the CFC being associated, for example, with a WinCC object.

By clicking on or selecting the relevant reference to a specific item in a related tool, the configuration engineer can change back and forth between related tools, e.g. CFC and WinCC, or navigate in both tools. Should the communication structure between the CFC function blocks and the WinCC objects be changed by the configuration engineer, only one central database needs to be updated, which means that the configuration engineer has access at all times to the current reference structures between the corresponding objects or function blocks.

In a further embodiment of the method according to the invention, navigation is possible not only between related tools but also between tools which do not normally provide a function of this kind, this being the case, for example, for configuring function blocks and interconnections in the CFC. To allow navigation in the Continuous Flow Chart itself, a graph reflecting the structure of the project or of its function blocks and interconnections is generated virtually as a navigation view.

Figure 2B:
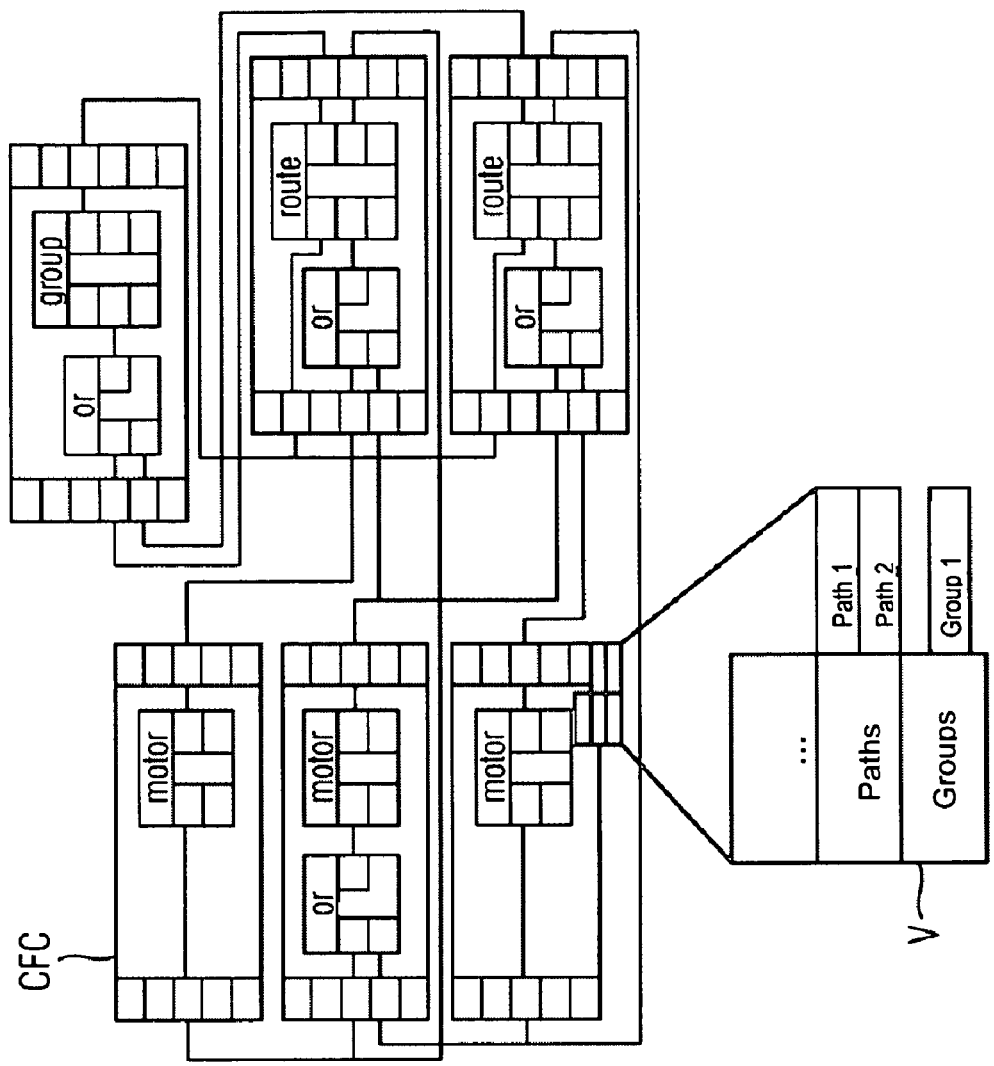
FIG. 2B is a CFC extract associated with the graph illustrated in FIG. 2A.
Figure 2A:
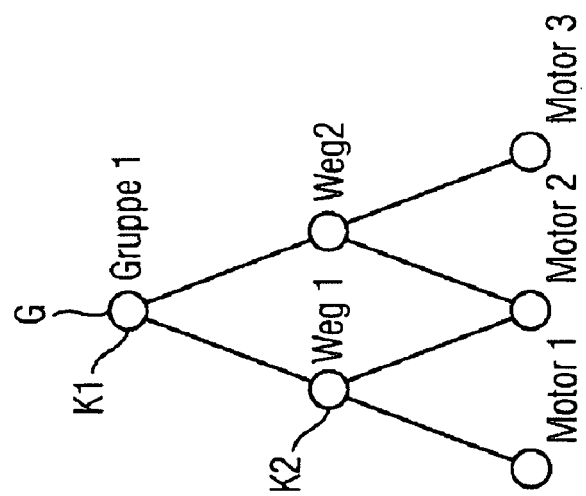
FIG. 2A is a graph for a group containing paths connected to motors.

FIG. 2 shows a graph G of this kind, e.g. for a group 1 containing a path 1 and a path 2, the path 1 being connected to a motor 1 and a motor 2 and-the path 2 likewise connected to the motor 2 and a motor 3. The associated CFC extract likewise contained in FIG. 2 additionally shows, for example, a reference V with the following entries from the graph G for the function block motor 2, as generated, e.g. by clicking on the symbol for the motor 2:

Groups: group 1
Paths: path 1, path 2
The entry ". . ." indicates that in general not just two hierarchy levels are possible.

To implement this method, the configuration engineer first determines a set of function block types as a node set of the graph and, from the node set, a set of interconnection interfaces for each function block type. In addition, a set of connection function blocks not contained in the node set is defined by the configuration engineer. The graph is now calculated from a set of CFC charts on the basis that each function block from the set of CFC charts is a node of the graph precisely when its function block type is in the node set and that the set of edges of the graph is the maximum set of edges between the adjacent nodes K1 and K2 of the graph, the edges being formed according to the following rule:

There exist interconnections between the associated function blocks of the adjacent nodes K1 and K2, or a chain of interconnections beginning in K1 and ending in K2, so that the connected function blocks are in the chain including the set of connection function blocks, so that the interconnection connects interfaces which are in the relevant interconnection interfaces.

If during configuration of the function blocks and interconnections in the CFC the interconnection information is changed, according to the above method a new graph is generated and displayed in each case, references to the function blocks being specified or associated with the nodes. The configuration engineer can now navigate in the CFC charts by clicking on or selecting these references.

Inter-applicational filing of engineering data makes possible a significant reduction in navigation time/cost and a reduction in the operations involved in the maintenance of plant documentation. According to the invention, any reference structures can be generated, not only hierarchical reference structures. A large number of the connections or hyperlinks can therefore be generated or computed automatically on the basis of the connection actually present between the function blocks. The automatically generated or computed hyperlinks can be compared with the actual links and the configuration or its progress can be checked.

The invention has been described in detail with particular reference to preferred embodiments thereof and examples, but it will be understood that variations and modifications can be effected within the spirit and scope of the invention.

What is claimed is:

1. A method for representing the configuration of an electrical system, comprising:
   generating and displaying configured function blocks of the electrical system as a first set of representations of physical objects of the electrical system;
   generating and displaying configured objects as a second set of representations of physical objects of the electrical system corresponding to the configured function blocks;
   creating communication variables in the second representation associated with the configured function blocks;
   assigning at least one of the communication variables to at least one of the configured objects;
   converting information formed by said creating and assigning into a first document formulated in a page description language, the first document containing first references to corresponding configured objects being associated with at least one of the functions blocks, and into a second document formulated in the page description language, and the second document containing second references to corresponding function blocks being associated with at least one of the configured objects; and
   displaying the first and second documents.

2. A method according to claim 1, further comprising providing navigation between the first and second set of representations of the function blocks via the first and second references.

3. A method according to claim 1, further comprising changing at least one of the first and second references if the information about at least one of the configured function blocks and configured objects changes.

4. A computer-readable medium encoded with a computer program that when executed by a processor controls the processor to perform a method, comprising:

configuring function blocks wherein configuring the function blocks includes creating communication variables associated with the configured function blocks;

configuring objects associated with the configured function blocks and mapping the configured objects to respective function blocks via communication variables wherein configuring the objects includes assigning at least one of the communication variables to at least one of the configured objects; and converting information formed by said creating and assigning into a first document in a page description language referring to configured objects and a second document in the page description language referring to function blocks using the mapping; and displaying the first and second documents.

\* \* \* \* \*